(12) United States Patent
Kuells

(10) Patent No.: US 9,838,813 B2
(45) Date of Patent: Dec. 5, 2017

(54) SELF DIAGNOSTIC SPEAKER LOAD IMPEDANCE TESTING SYSTEM

(71) Applicant: Atlas Sound LP, Ennis, TX (US)

(72) Inventor: Jeffery Brian Kuells, Foresthill, CA (US)

(*) Notice: Subject to any disclaimer, the term of this patent is extended or adjusted under 35 U.S.C. 154(b) by 0 days.

(21) Appl. No.: 14/736,119

(22) Filed: Jun. 10, 2015

(65) Prior Publication Data

US 2015/0365774 A1  Dec. 17, 2015

Related U.S. Application Data

(60) Provisional application No. 62/012,300, filed on Jun. 14, 2014.

(51) Int. Cl.
*H04R 29/00* (2006.01)
*H03F 1/52* (2006.01)
*H04R 3/00* (2006.01)

(52) U.S. Cl.
CPC ............ *H04R 29/007* (2013.01); *H03F 1/52* (2013.01); *H03F 2200/426* (2013.01); *H04R 3/007* (2013.01)

(58) Field of Classification Search
CPC ......... H04R 29/007; H04R 3/007; H03F 1/52; H03F 2200/426
See application file for complete search history.

(56) References Cited

U.S. PATENT DOCUMENTS

| | | | |
|---|---|---|---|
| 5,719,526 A * | 2/1998 | Fink | H03F 1/34 324/713 |
| 43,461 A1* | 6/2012 | Hand | H03F 1/523 330/10 |
| 2011/0095817 A1* | 4/2011 | Yamada | H03F 1/52 330/98 |
| 2016/0165348 A1* | 6/2016 | Ilango | H04R 29/001 381/59 |

* cited by examiner

*Primary Examiner* — Andrew L Sniezek
(74) *Attorney, Agent, or Firm* — Keith L. Jenkins, Registered Patent Attorney, LLC; Keith L. Jenkins

(57) ABSTRACT

A self diagnostic loudspeaker load impedance testing system, or Push Here Diagnostic (PHD) system, located within a mixer/amplifier for testing loudspeaker connections to the mixer amplifier during installation and maintenance. The system includes a test signal source that replaces the normal audio input to the amplifier during test. A PHD analyzer within the mixer amplifier analyzes the response of the loudspeakers and related wiring to the test signal to detect a total system impedance that exceeds the amplifier rating and to detect short circuits in the wiring. The PHD analyzer illuminates an indicator when a fault occurs. The test is initiated by depressing a momentary contact switch within the mixer amplifier housing by inserting a tool through an opening in the mixer amplifier housing.

20 Claims, 16 Drawing Sheets

SELF DIAGNOSTIC SPEAKER LOAD IMPEDANCE TESTING SYSTEM

CROSS REFERENCE TO RELATED APPLICATIONS

This application claims the benefit of U.S. provisional patent application Ser. No. 62/012,300 filed 14 Jun. 2014 to the same inventor, the contents of which are incorporated herein in its entirety.

FIELD OF ART

The present invention relates to a built-in test system for distributed audio systems, such as 70.7 volt and 100 volt systems, with multiple speakers, such as public address systems. The present invention more particularly relates to a built in test system used during installation of an audio system to test speaker connections to the amplifier.

STATEMENT REGARDING FEDERALLY SPONSORED RESEARCH AND DEVELOPMENT

None.

SUMMARY OF THE INVENTION

The Atlas Sound AAPHD Mixer Amplifier Series and other future Atlas Sound Products that feature a mixer amplifier Self Diagnostic Speaker load Impedance Testing System, also known as a Push Here Diagnostic (PHD) system. The PHD feature of the AAPHD Series mixer amplifiers is simple to use and is very effective for running a self-diagnostic system test to assure the amplifier of the mixer amplifier has the proper speaker load/impedance applied. This test requires no external diagnostic tools to run the test. The PHD circuit is incorporated in the Atlas Sound AA Series Mixer Amplifiers. Many amplifiers fail because an incorrect load is applied to the amplifier. This is especially true when using the amplifier in a 70.7V or 100V distributed audio speaker system.

DESCRIPTION OF THE FIGURES OF THE DRAWINGS

The present invention will hereinafter be described in conjunction with the following drawing figures, wherein like numerals denote like elements, and self diagnostic speaker load impedance testing system

DETAILED DESCRIPTION OF THE INVENTION

Figure 1:
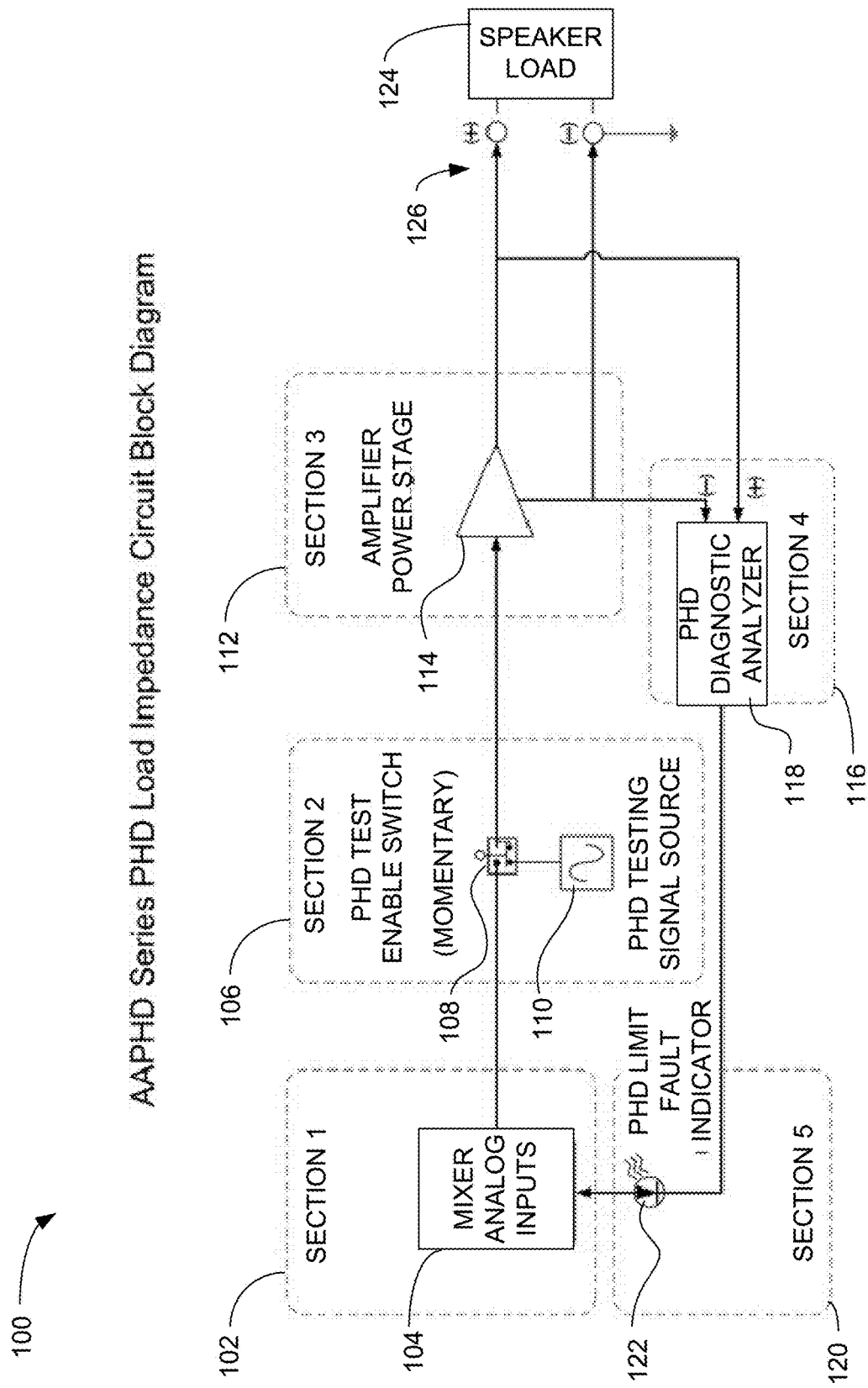
FIG. 1 is a diagrammatic view illustrating an exemplary embodiment of the self diagnostic speaker load testing system, according to a preferred embodiment of the present invention.

FIG. 1 is a diagrammatic view illustrating an exemplary embodiment of the self diagnostic speaker load testing system 100, according to a preferred embodiment of the present invention. The AAPHD Series PHD Self Diagnostic Test System 100 is divided into five sections 102, 106, 112, 16 and 120. Each section 102, 106, 112, 16 or 120 is described below but all are required for a complete PHD self-diagnostic speaker load testing system 100. A commercial audio mixer amplifier 200 (see FIG. 2A-2B) consists of two main segments that make up the specific product category called mixer amplifier 200. The first section 102 includes mixer 104 that comprises an interface assembly that accepts analog audio signals from multiple sources such as microphones and CD players, combines them into a mono signal, and delivers them through the second section 106 to the amplifier 114 in the third section 112. The second section 106 includes PHD test enable switch 108 and the testing signal source 110. The third segment of the mixer amplifier 200 is the amplifier 114 that receives the mono signal from the audio mixer 104, via the PHD test enable switch 108, and amplifies the low level audio signal into a much higher power level. Speakers 302 (see FIG. 3, one of six labeled) (collectively, speaker system 300) connect directly to the amplifier analog output 126, collectively creating speaker load 124.

Various embodiments of AAPHD Series Mixer Amplifiers 200 (see FIG. 2A-2B) vary in mixer 104 features and vary in output power to the speakers 302. All AAPHD Series Mixer Amplifiers 200 have the same method of operation. FIG. 1 is the block diagram of the AA Series PHD self diagnostic speaker load testing system 100 circuit. The first section 102 includes the analog input mixer 104 that sums all of the analog inputs into one signal to feed the amplifying power stage 112. The second section 106, which precedes the amplifying power stage 112, includes the PHD testing signal source 110 and PHD test enable switch 108. On the front panel 206 (see FIG. 2A) of the AAPHD Series mixer amplifier 200, a recessed momentary switch 108 is used to activate the PHD testing signal source 110. The third section 112 amplifies the signal from mixer section 102. The amplifier stage 112 is susceptible to failure if an incorrect speaker load 124 is applied. The purpose of the PHD self diagnostic speaker load testing system 100 is to prevent the system from failure during installation and customer use. The fourth section 116 includes the PHD diagnostic analyzer 118, which, when implemented, determines if the impedance of the speaker load 124 applied to the AA PHD mixer amplifier 200 meets the safe operating area specification of the amplifier 114. The PHD diagnostic analyzer 118 calculates the impedance of the speaker load 124 applied to the amplifier 114, determines if the current required has exceeded the safe operating limits of the amplifier 114, and sends a fault command with an indicator 122 to inform the installer to inspect the installation of the speaker system. The fifth section 120 includes the PHD limit fault indicator 122, which is exemplified as an LED. If the impedance of the speaker load 124 applied to the AA PHD mixer amplifier 200 does not meet the safe operating area for amplifier 114, the PHD limit fault indicator 122 will illuminate, informing the installer there is an installation issue or fault within the speaker system.

Figure 10:
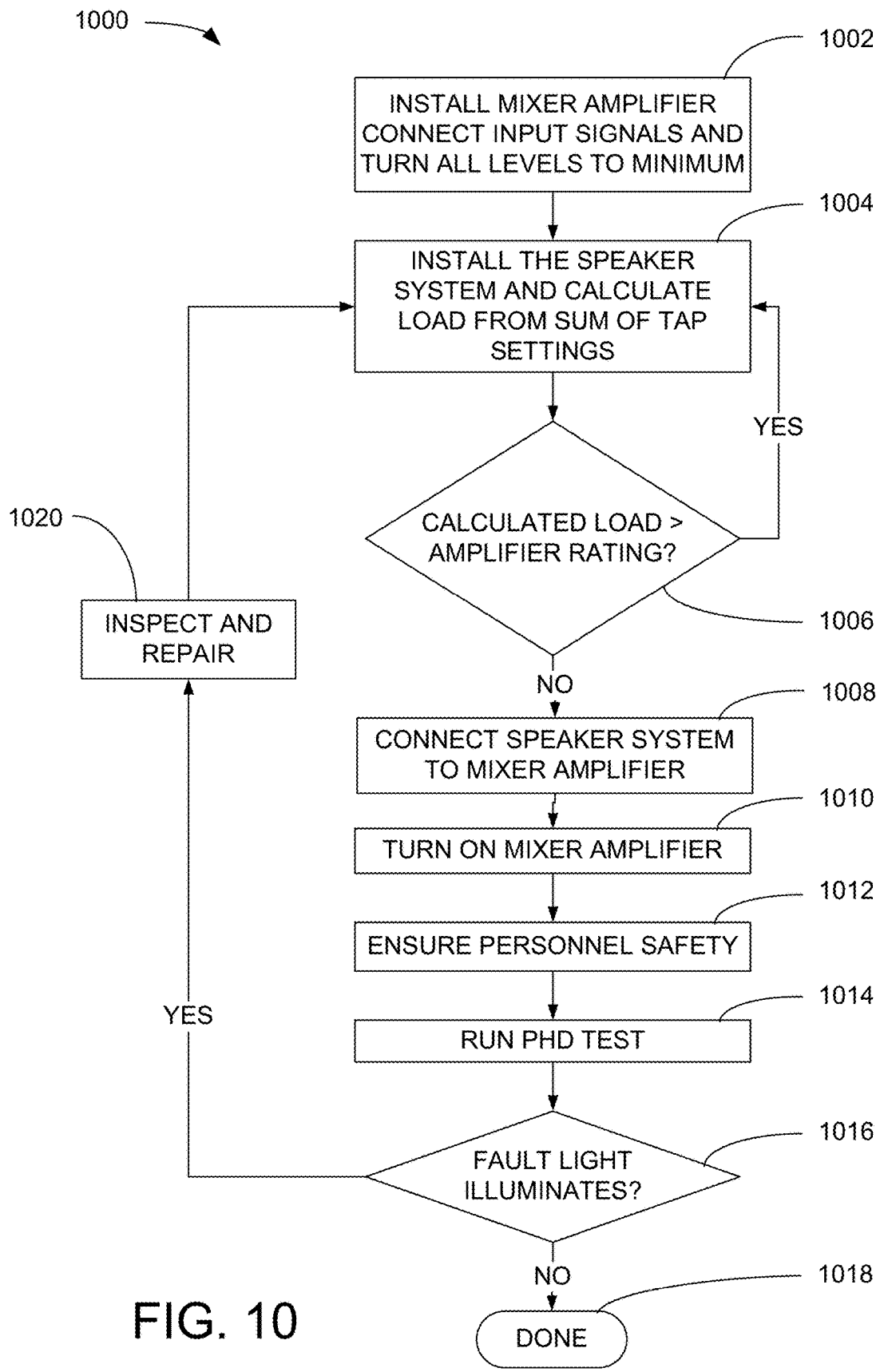
FIG. 10 is a process diagram illustrating a method of use of an exemplary embodiment of the self diagnostic speaker load testing system, according to a preferred embodiment of the present invention.

FIG. 10 is a process diagram illustrating a method 1000 of use of an exemplary embodiment of the PHD self diagnostic speaker load testing system 100, according to a preferred embodiment of the present invention. In operation, the PHD self diagnostic load testing system 100 is preferably used via a six-step process 1000. In step 1002, install the AAPHD mixer amplifier 200, connect the input signals and turn all levels to minimum. Do not attach the speaker system 300 to the mixer amplifier 200 while connecting inputs and setting levels. In step 1004, install the speaker system 300 per the design, double check speaker tap settings. The sum total power for all the speakers 302 should not exceed the maximum power rating of the amplifier 114 installed. If 1006 the sum total power for all the speakers 302 does exceed the maximum power rating of the amplifier 114, correct the installation in step 1204. In step 1008, connect the speaker system 300 to the mixer amplifier 200. Pay special attention when connecting the speaker leads to the proper terminals on the mixer amplifier 200. In step 1010, turn the mixer amplifier 200 on. In step 1012, make sure no people are present or near the speakers 302 during the diagnostic test without taking proper hearing precautions. A one-half watt test tone will be present at each speaker 302. The audible sound pressure level (SPL) will be based on the power tap setting at each speaker 302 and sensitivity specification of the speaker 302. The audible SPL level may be alarming to some people. Wear proper hearing protection before starting the test. In step 1014, activate the PHD circuit by inserting a small, pointed tool through the hole 212 on the front panel 208 labeled PHD. Press and hold the momentary switch 108 for 1-2 seconds, then release. A test tone will be audible through the speakers 302. If the limit fault LED 122 does not illuminate yellow, the system is properly set up and no errors in the system were found 1018. Continue or complete the installation. If 1016 the limit fault indicator 122 does turn yellow, STOP and inspect the speaker system 300 for one of the faults listed above and repair the fault 1020. Re-run the test after the fault condition has been fixed. Continue until the limit fault indicator LED 122 does not illuminate.

Figure 2A:
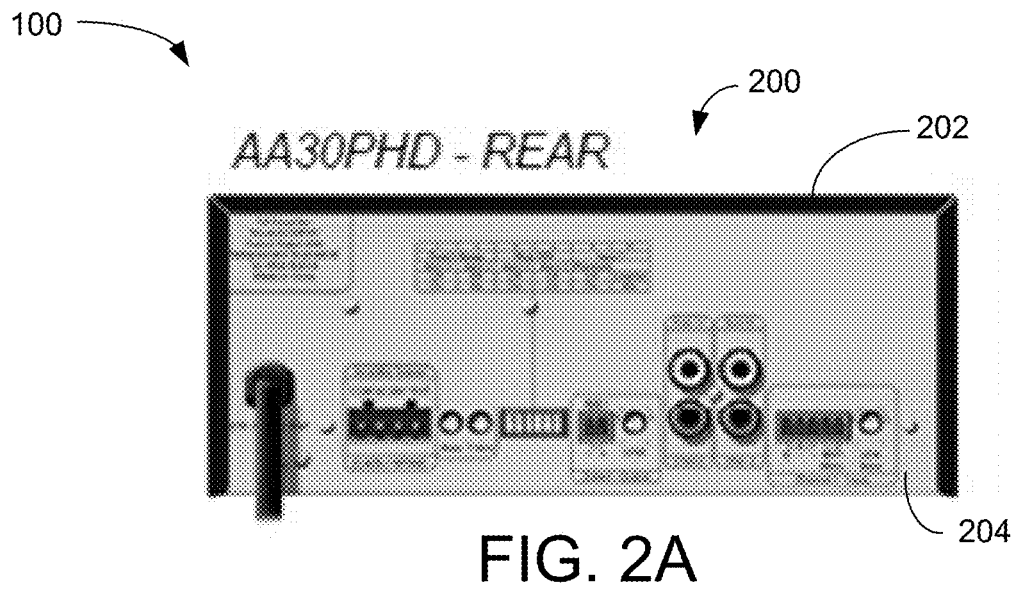
FIG. 2A is a rear elevation view illustrating an exemplary embodiment of the self diagnostic speaker load testing system in a mixer amplifier, according to a preferred embodiment of the present invention.

FIG. 2A is a rear elevation view illustrating an exemplary embodiment of the self diagnostic speaker load testing system 100 in a mixer amplifier 200, according to a preferred embodiment of the present invention. Rear panel 204 in case 202 provides power, audio input, and speaker output connections, as shown.

Figure 2B:
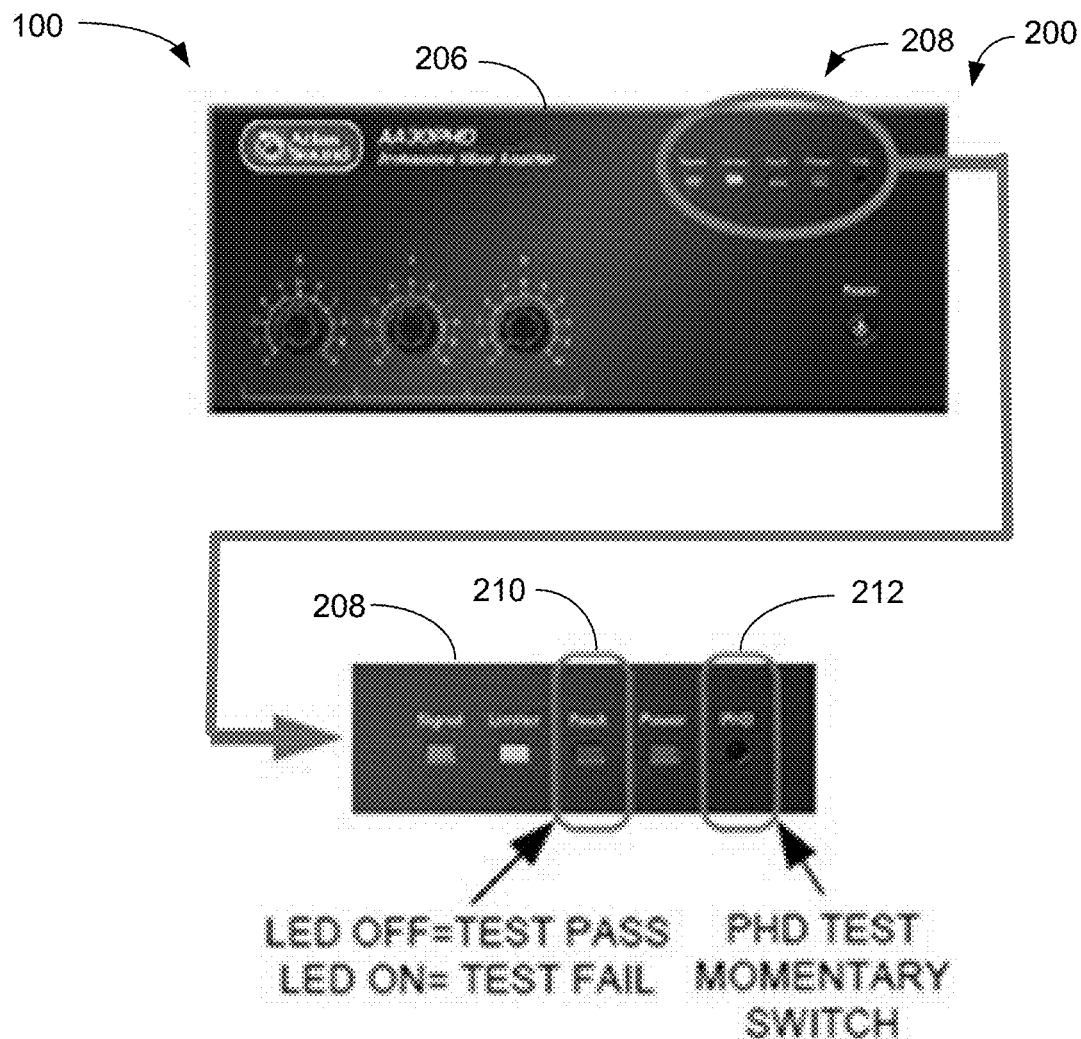
FIG. 2B is a front elevation view illustrating an exemplary embodiment of the self diagnostic speaker load testing system in a mixer amplifier, according to a preferred embodiment of the present invention.

FIG. 2B is a front elevation view illustrating an exemplary embodiment of the self diagnostic speaker load testing system 100 in a mixer amplifier 200, according to a preferred embodiment of the present invention. Front panel 206 provides user interface devices and the PHD test display 208, as shown. Included in the test display 208 is a window 210 to the limit fault indicator 122 and a labeled hole 212 for activating the system. Additional test indicators are also provided.

Figure 3:
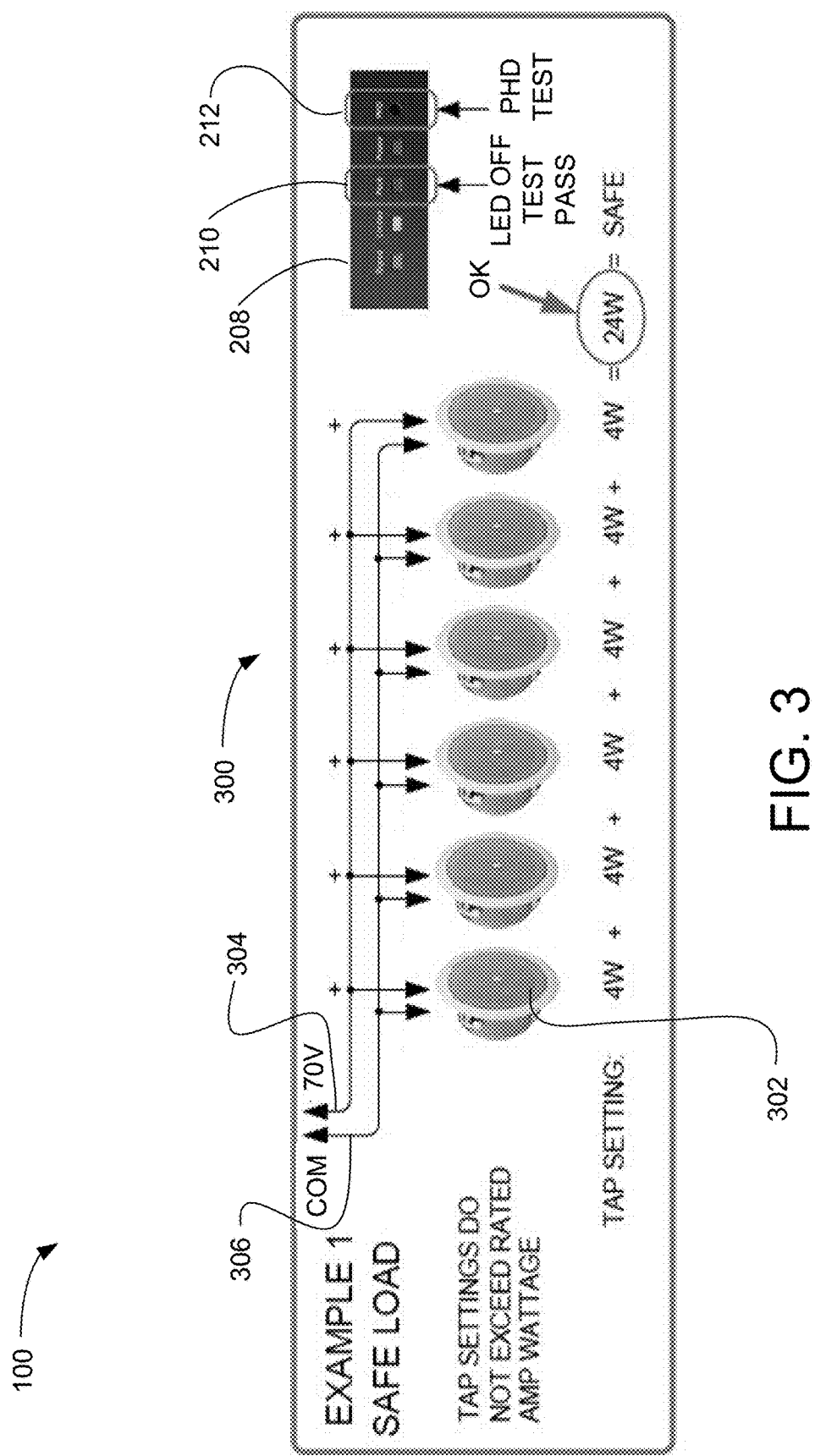
FIG. 3 is a diagrammatic view illustrating an exemplary embodiment of the self diagnostic speaker load testing system in a mixer amplifier, according to a preferred embodiment of the present invention.

FIG. 3 is a diagrammatic view illustrating an exemplary embodiment of the self diagnostic speaker load testing system 100 in a mixer amplifier 200, according to a preferred embodiment of the present invention. Without running a distributed audio impedance diagnostic test during installation, failure may occur to the amplifier if a fault is in the speaker system. There are a few common failure points that can occur during speaker system installation. The PHD feature runs a series of tests to diagnose and identify if the speaker system has a fault condition or if the impedance of the speaker load 124 matches the selected mixer amplifier 200. The following product diagrams describe the possible fault conditions that are common. The illustrations in these diagrams feature the Atlas Sound AA30PHD Mixer Amplifier 200. Note: The PHD circuit operates in the identical manor for the complete AAPHD Series. FIG. 3 illustrates proper 70V amplifier loading. Each speaker 302 (one of six labeled) is connected to mixer amplifier 200 via 70 volt power line 304 and an audio signal, or com, line 306. In FIG. 3, the installation is correct, as the sum of the power required by all speakers 302 is less than the power rating of the mixer amplifier 200. The illustrations showing six speakers 302 is not intended to suggest that only six speakers can be connected at any given time: the number is limited only by the power of the mixer amplifier 200 and the power requirements of the speakers 302.

Figure 4:
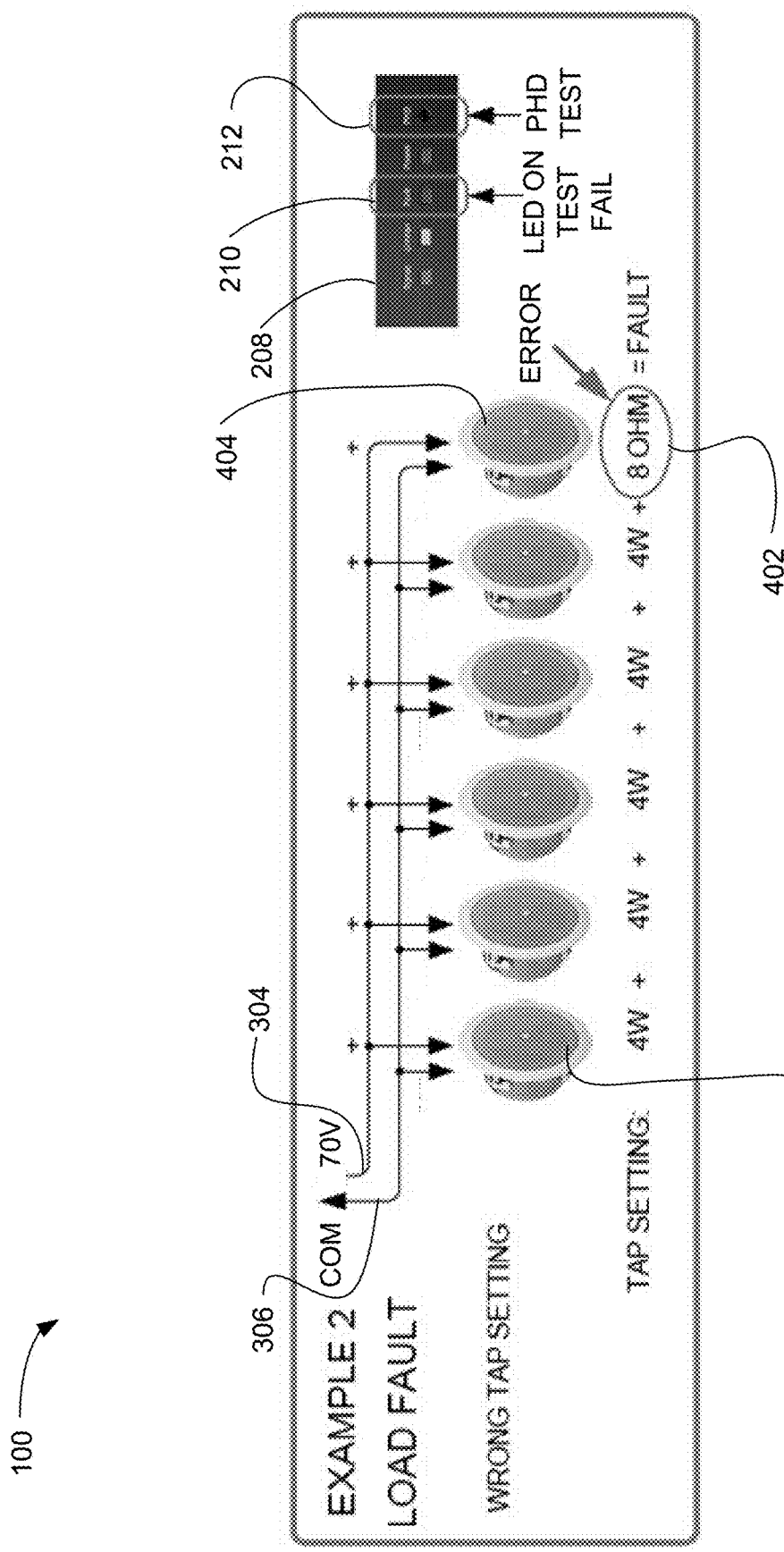
FIG. 4 is a diagrammatic view illustrating an exemplary embodiment of the self diagnostic speaker load testing system, according to a preferred embodiment of the present invention.

FIG. 4 is a diagrammatic view illustrating an exemplary embodiment of the self diagnostic speaker load testing system 100, according to a preferred embodiment of the present invention. In the example of FIG. 4, the tap setting 402 on speaker 404 has been set incorrectly, resulting in a wrong impedance being detected by the self diagnostic speaker load testing system 100. A tap setting involves the selection of a particular tap on a transformer integral to the speaker 302 (one of six labeled) to determine the power drawn by the speaker 302. In the configuration of FIG. 4, the power (wattage) required by the speaker load 124 would exceed the power rating of the mixer amplifier 200. Improper load selection or power tap setting on 70V speaker systems generates a fault. It is very common when using many speakers to have one of the speakers tapped accidently at 8Ω. This error will definitely be very hard on a 70V amp and in most situations cause the mixer amplifier 200 to fail within a few days. This kind of error is easy to make, time consuming to find and costly to fix.

Figure 5:
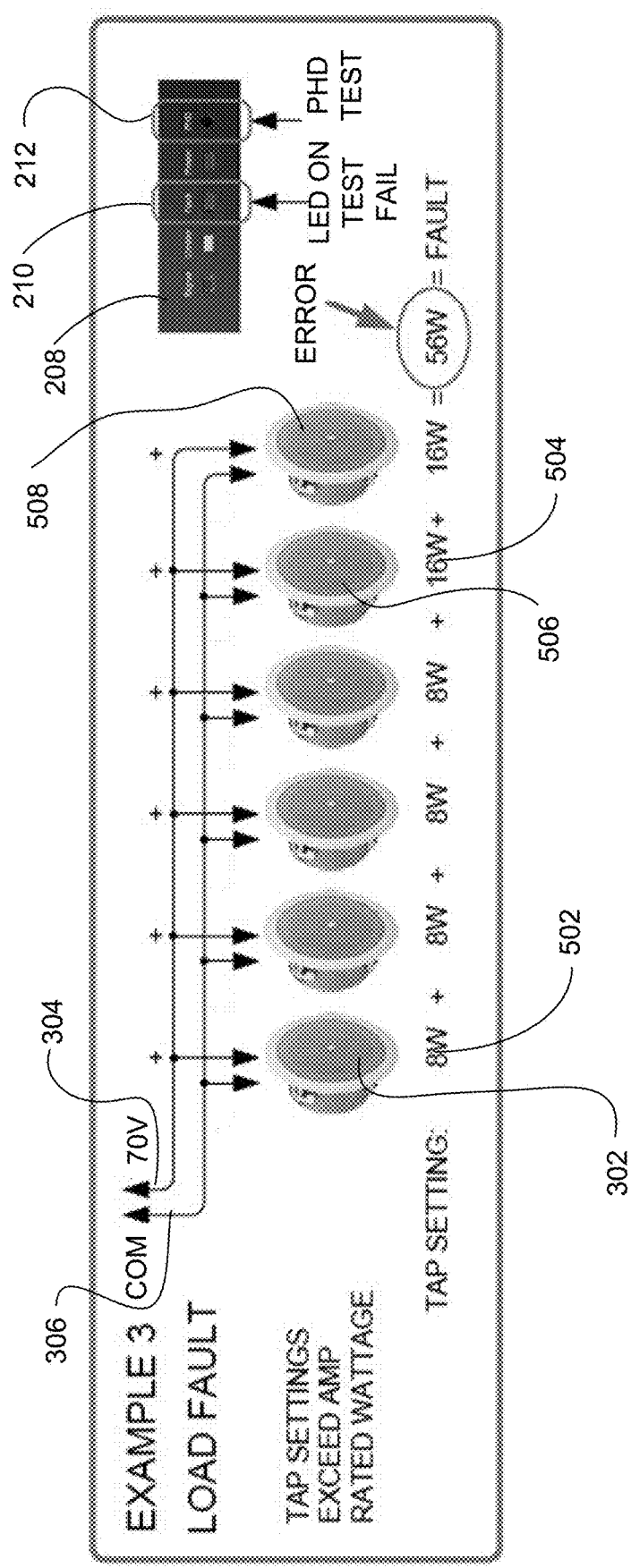
FIG. 5 is a diagrammatic view illustrating an exemplary embodiment of the self diagnostic speaker load testing system, according to a preferred embodiment of the present invention.

FIG. 5 is a diagrammatic view illustrating an exemplary embodiment of the self diagnostic speaker load testing system 100, according to a preferred embodiment of the present invention. In the example of FIG. 5, the tap setting 504 on speakers 506 and 508 have been set incorrectly, resulting in a wrong impedance being detected by the self diagnostic speaker load testing system 100. In the configuration of FIG. 5, the power (wattage) required by the speaker load 124 would exceed the power rating of the mixer amplifier 200. A fault is generated when too many speakers 302 are attached or the wrong power taps are selected. For non-limiting example, if a 50 watt mixer amplifier 200 is used in a 70V system and it has six speakers 302 all tapped at eight watts, but two of the speakers are accidently tapped at sixteen watts, the total power demand is fifty-six watts of power required to drive the system properly, which exceeds the power rating of the mixer amplifier 200. While it may work at low levels, as soon as the system needs to be louder the mixer amplifier 200 will be strained and fail over time. Most amplifier 114 failures are caused by improper installation on the speaker 302 side.

Figure 6:
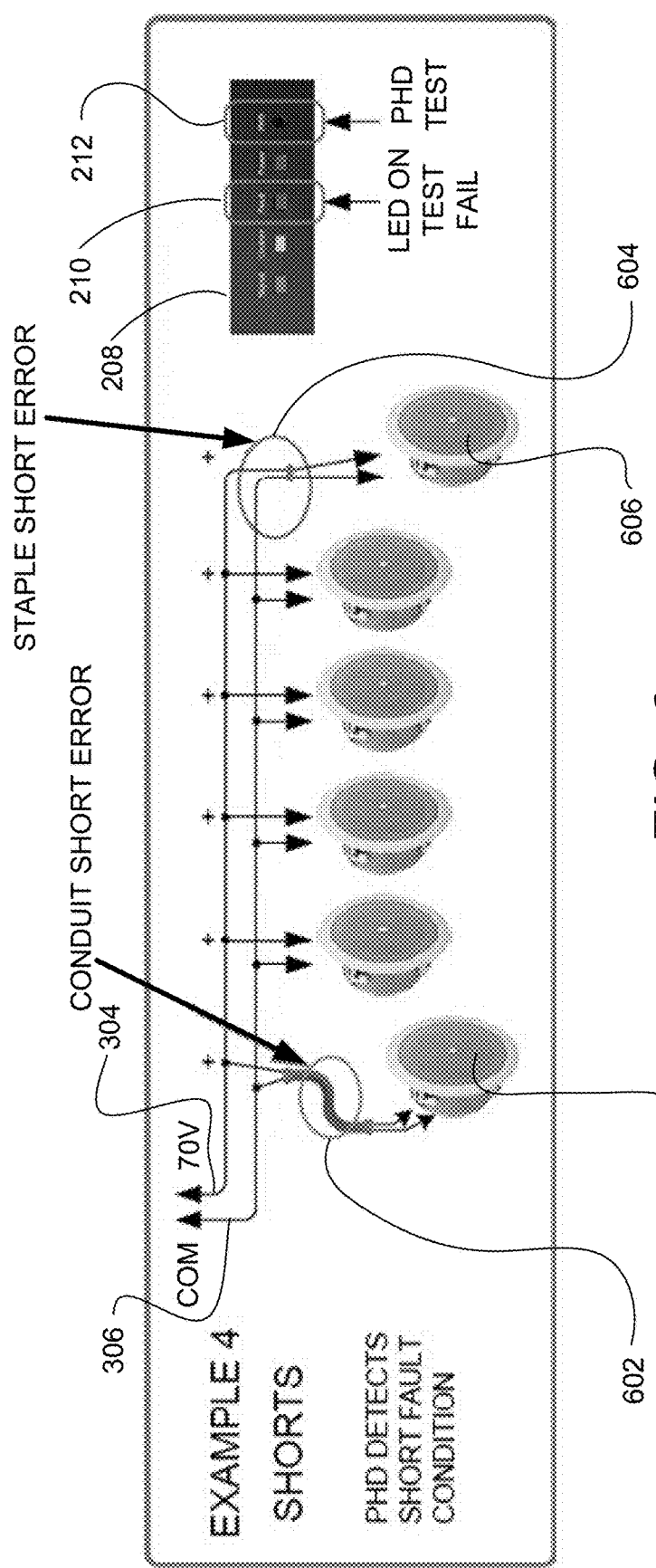
FIG. 6 is a diagrammatic view illustrating an exemplary embodiment of the self diagnostic speaker load testing system, according to a preferred embodiment of the present invention.

FIG. 6 is a diagrammatic view illustrating an exemplary embodiment of the self diagnostic speaker load testing system 100, according to a preferred embodiment of the present invention. Short circuits 602 or 604 will generate a fault. Short circuit 602 is a conduit short, in which the insulation on the wire is degraded and the wire shorts to the conduit. Short circuit 604 to speaker 606 is caused by a staple, intended to secure wires to environmental surfaces, penetrating the wire insulation and shorting out the power line 304 to the audio signal line 306. The self diagnostic speaker load testing system 100 detects these shorts as a fault and illuminates the fault indicator 122.

Figure 7A:
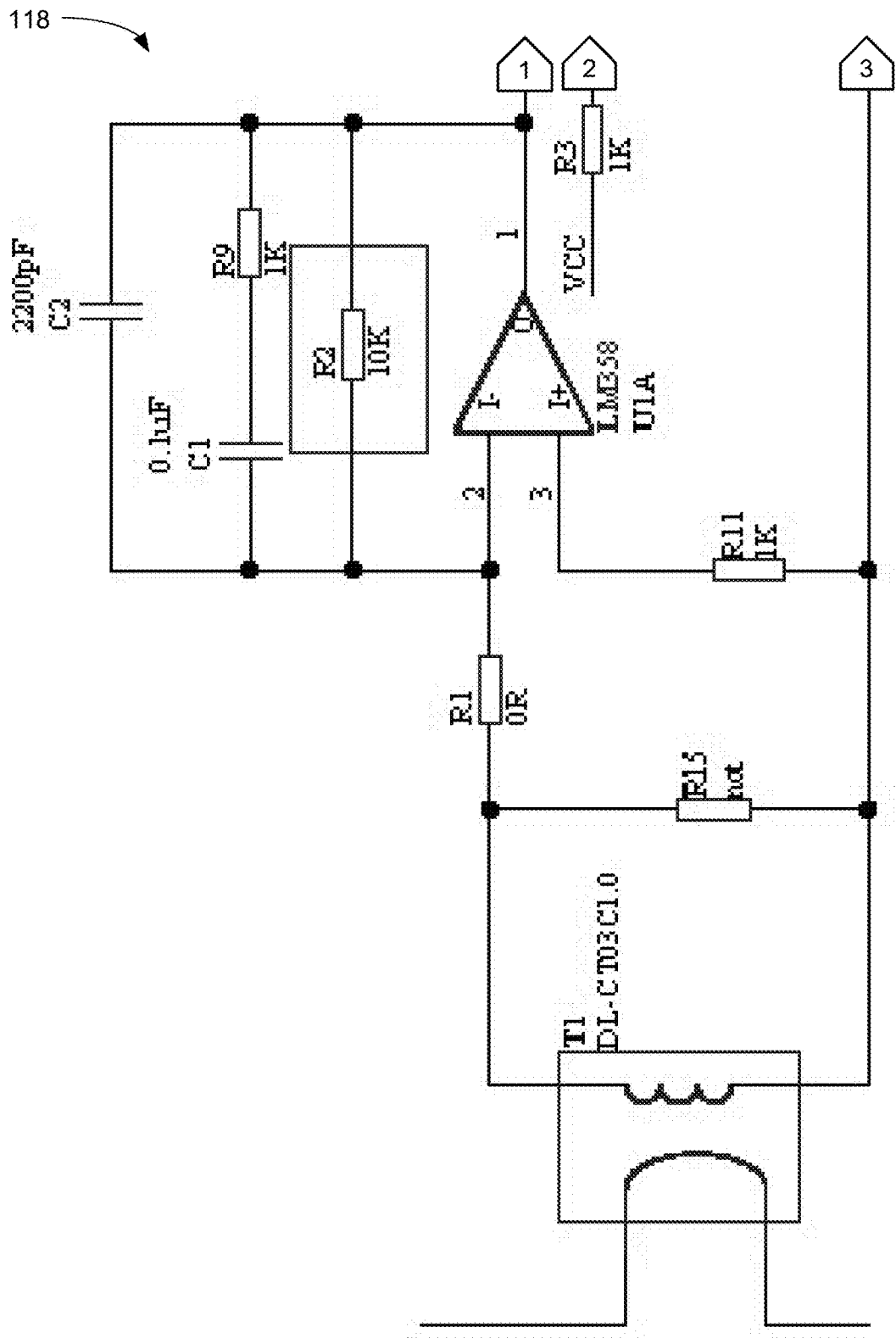
FIG. 7A is a schematic view illustrating a first portion of a first exemplary embodiment of a PHD analyzer of the self diagnostic speaker load testing system, according to a preferred embodiment of the present invention.

FIG. 7A is a schematic view illustrating a first portion of a first exemplary embodiment of a PHD analyzer 118 of the self diagnostic speaker load testing system 100, according to a preferred embodiment of the present invention. The second half of the schematic is in FIG. 7B, where the numbered connectors indicate corresponding lines on both FIG. 7A and FIG. 7B. The entire schematic is in the file wrapper of US provisional patent application number 62/012,300. The schematic is presented here for purposes of enablement. A person of skill in the art, enlightened by the present disclosure, would be able to make the first embodiment of the PHD analyzer 118 based on the schematic of FIG. 7A and FIG. 7B.

Figure 7B:
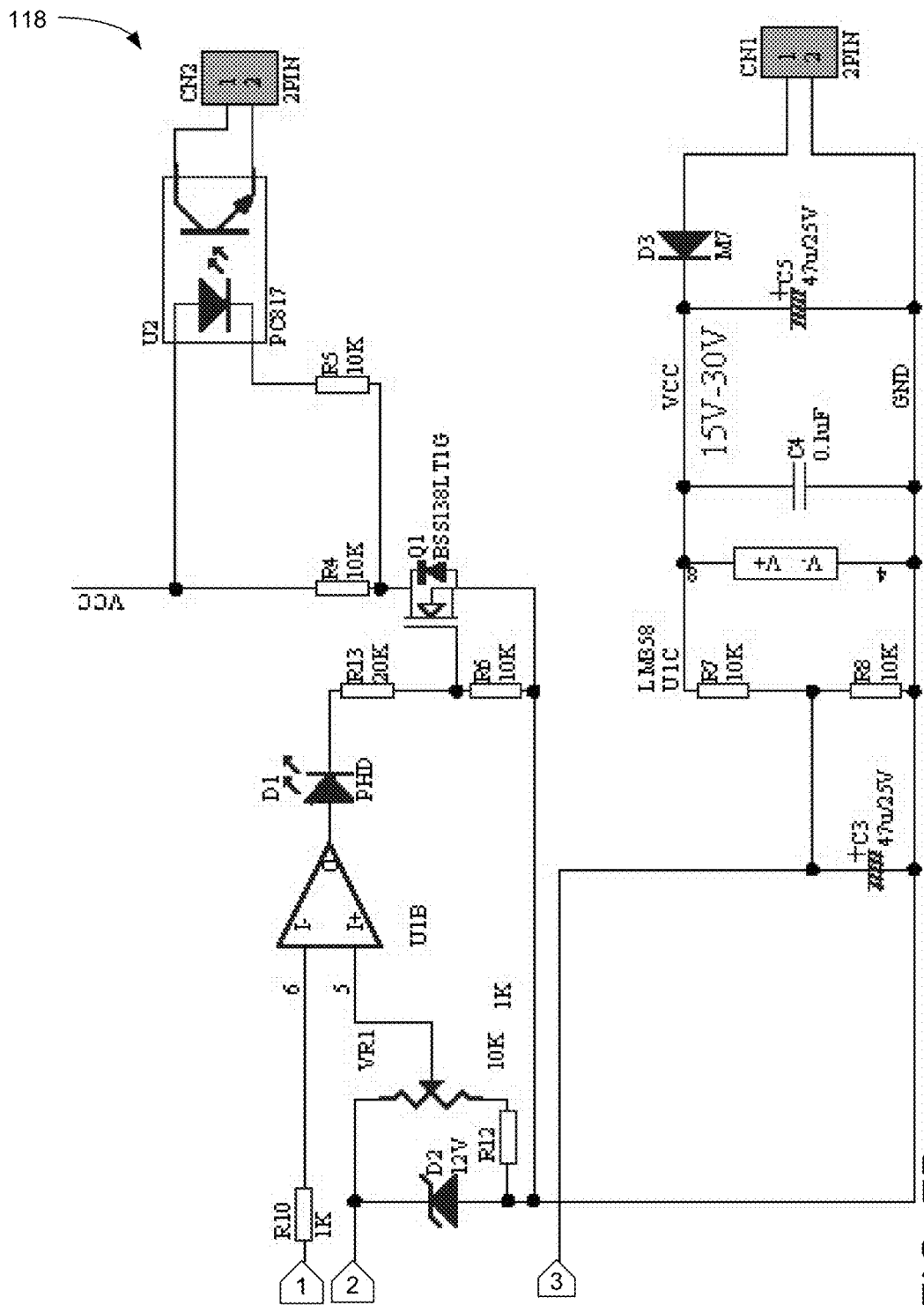
FIG. 7B is a schematic view illustrating a second portion of the first exemplary embodiment of a PHD analyzer of the self diagnostic speaker load testing system of FIG. 7A, according to a preferred embodiment of the present invention.

FIG. 7B is a schematic view illustrating a second portion of the first exemplary embodiment of a PHD analyzer 118 of the self diagnostic speaker load testing system 100 of FIG. 7A, according to a preferred embodiment of the present invention, as discussed above.

Figure 8A:
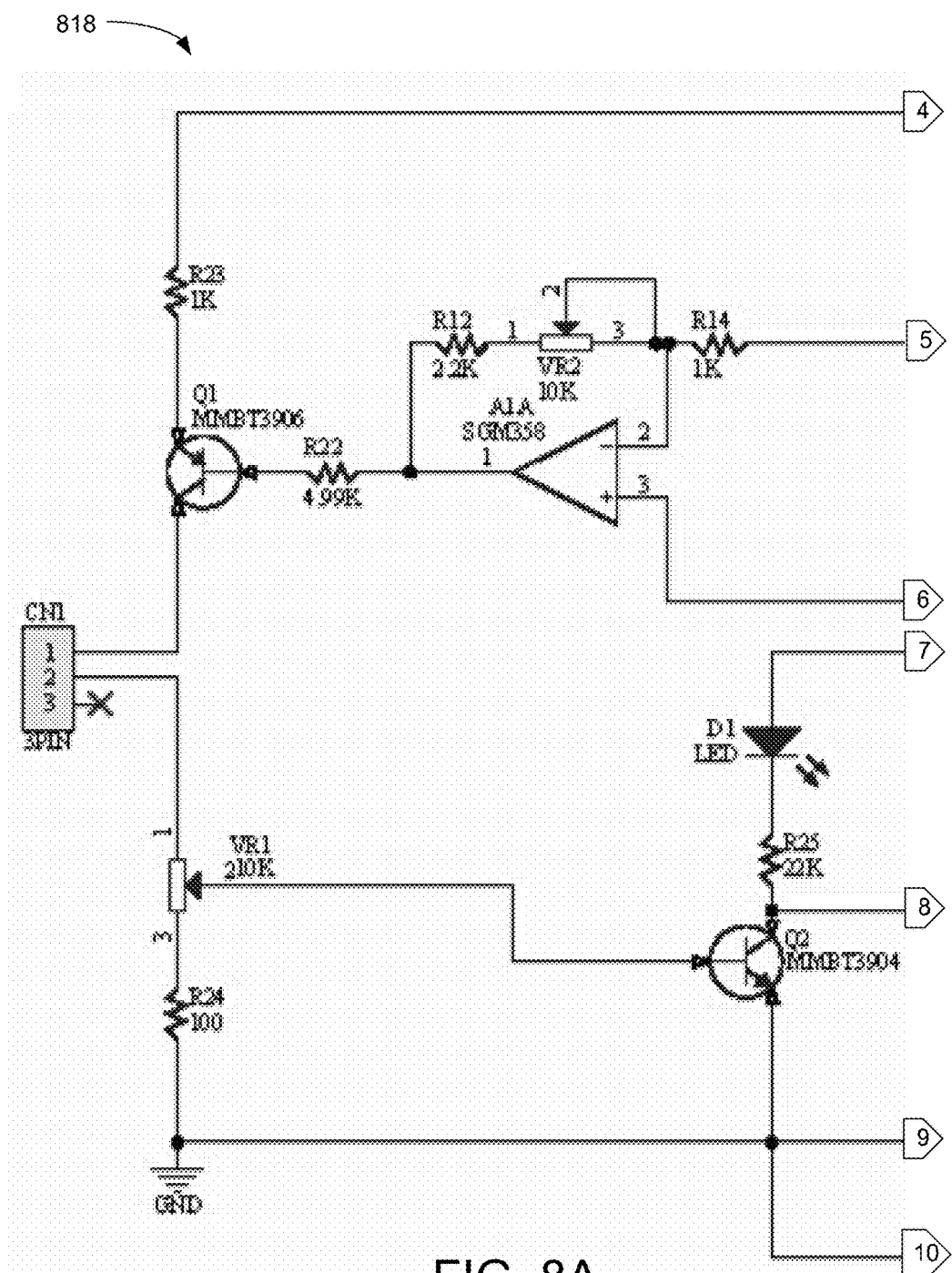
FIG. 8A is a schematic view illustrating a first portion of a second exemplary embodiment of a PHD analyzer of the self diagnostic speaker load testing system, according to a preferred embodiment of the present invention.

FIG. 8A is a schematic view illustrating a first portion of a second exemplary embodiment of a PHD analyzer 818 of the self diagnostic speaker load testing system 100, according to a preferred embodiment of the present invention. PHD analyzer 818 is second embodiment of PHD analyzer 118. The second and third portions of the schematic are in FIG. 8B and 8C, where the numbered connectors indicate corresponding lines on FIG. 8A and FIG. 8B. The entire schematic is in the file wrapper of U.S. provisional patent application No. 62/012,300. The schematic is presented here for purposes of enablement. A person of skill in the art, enlightened by the present disclosure, would be able to make the second embodiment of the PHD analyzer 818 based on the schematic of FIGS. 8A, 8B, and 8C.

Figure 8B:
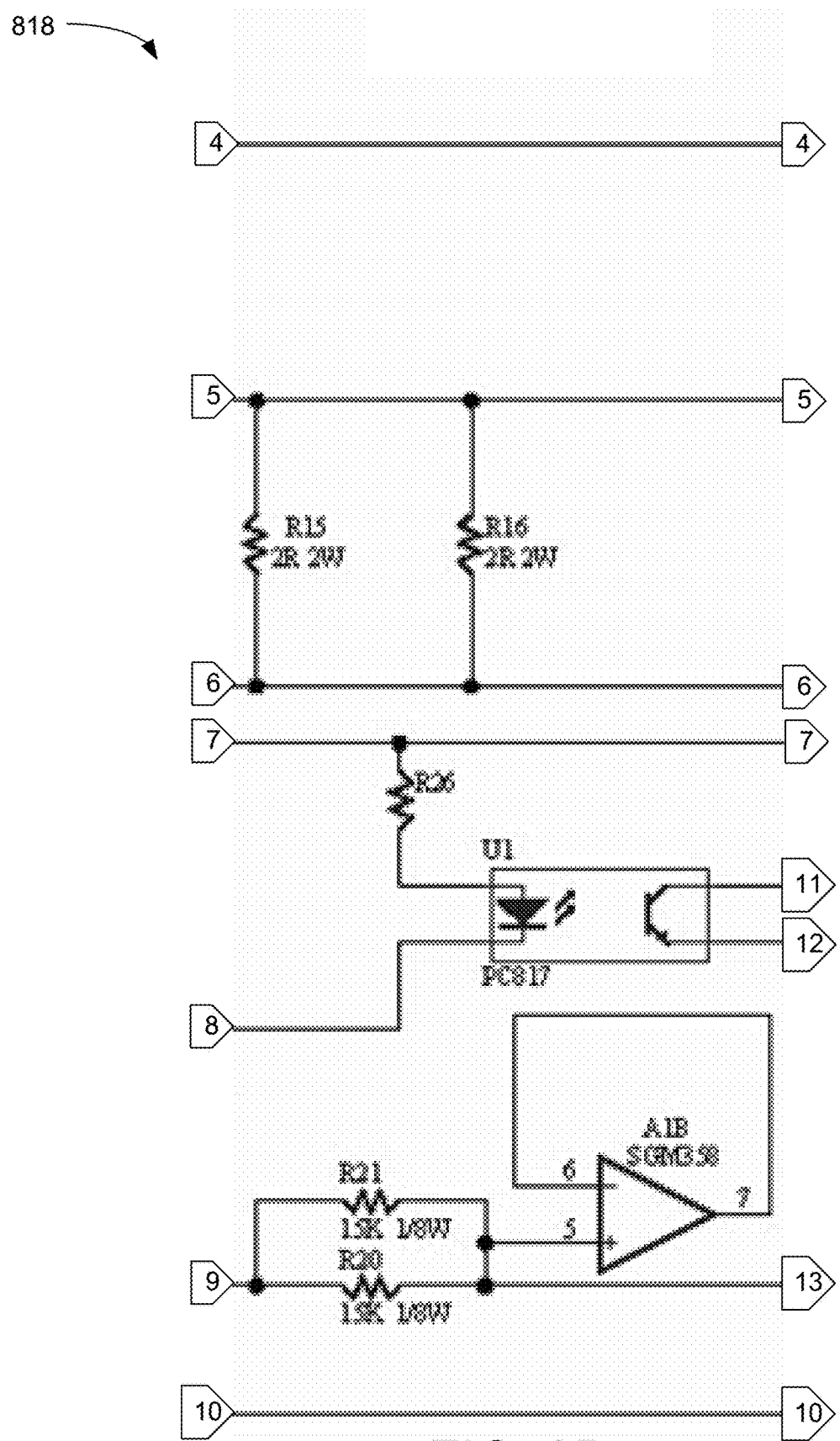
FIG. 8B is a schematic view illustrating a second portion of the second exemplary embodiment of a PHD analyzer of the self diagnostic speaker load testing system of FIG. 8A, according to a preferred embodiment of the present invention.

FIG. 8B is a schematic view illustrating a second portion of the second exemplary embodiment of a PHD analyzer 818 of the self diagnostic speaker load testing system 100 of FIG. 8A, according to a preferred embodiment of the present invention. The numbered connectors indicate corresponding lines on FIGS. 8A and 8C. The numbered connectors indicate corresponding lines on FIG. 8B.

Figure 8C:
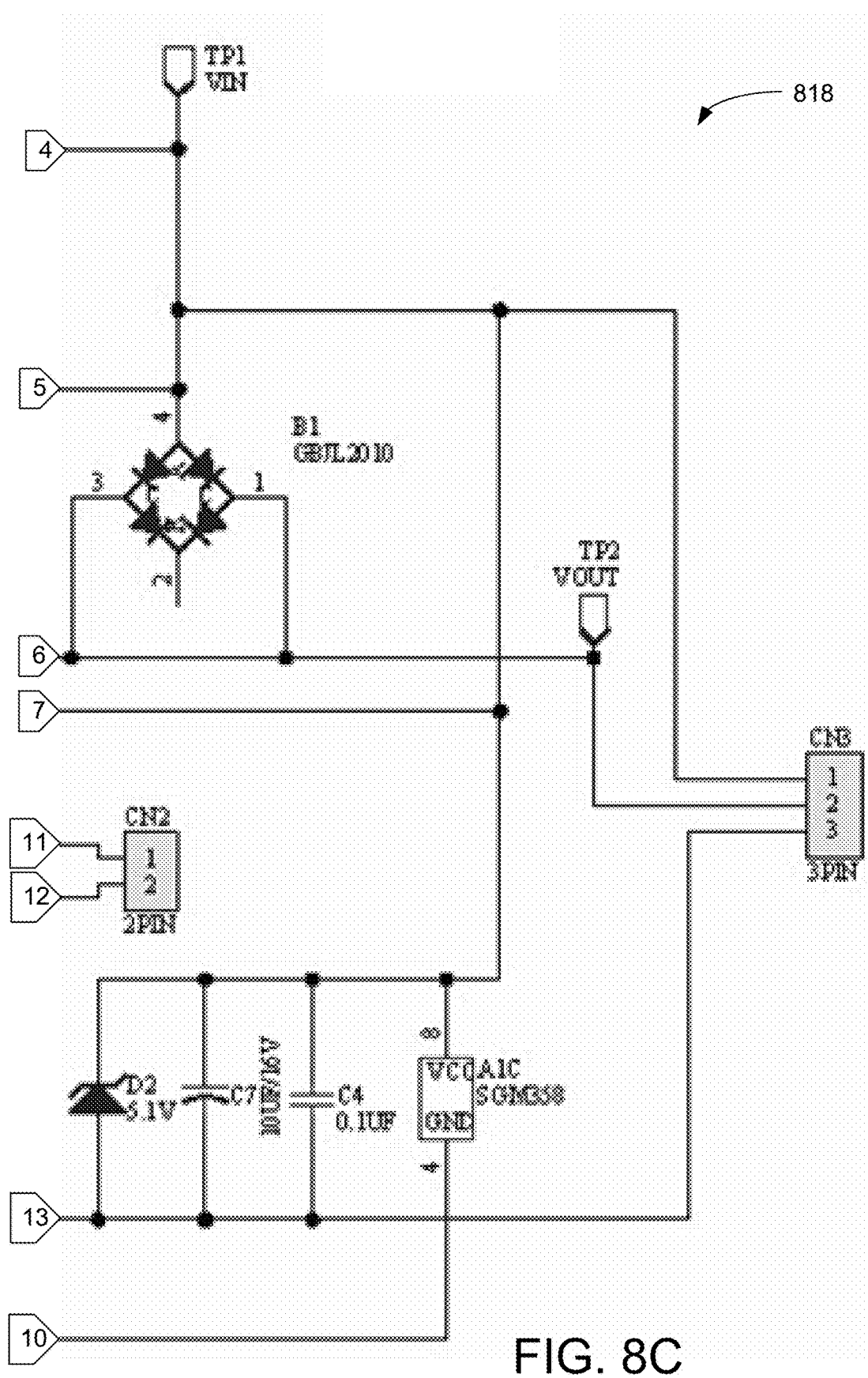
FIG. 8C is a schematic view illustrating a third portion of the second exemplary embodiment of a PHD analyzer of the self diagnostic speaker load testing system of FIG. 8A, according to a preferred embodiment of the present invention.
Figure 9A:
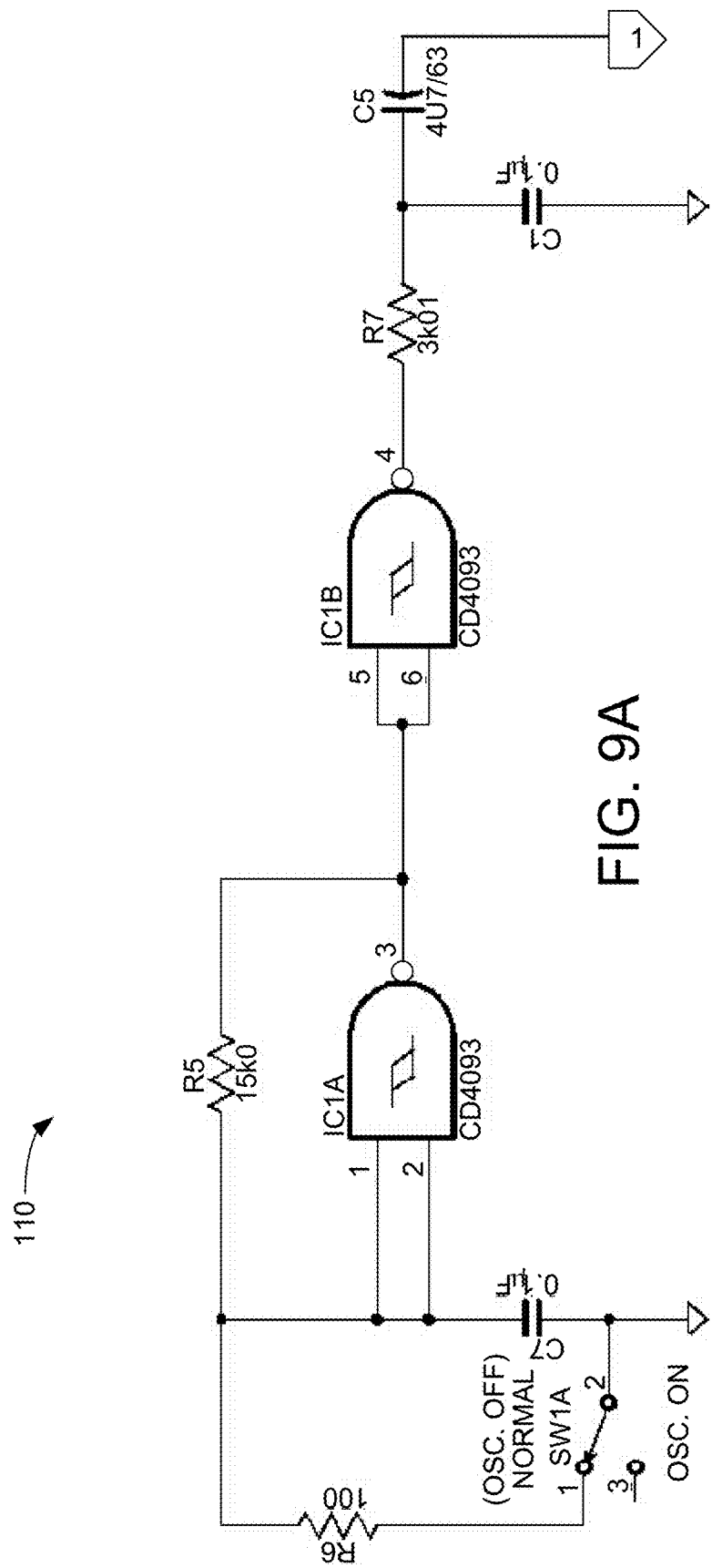
FIG. 9A is a schematic view illustrating a first portion of an exemplary embodiment of a PHD testing signal source of the self diagnostic speaker load testing system, according to a preferred embodiment of the present invention.
Figure 9B:
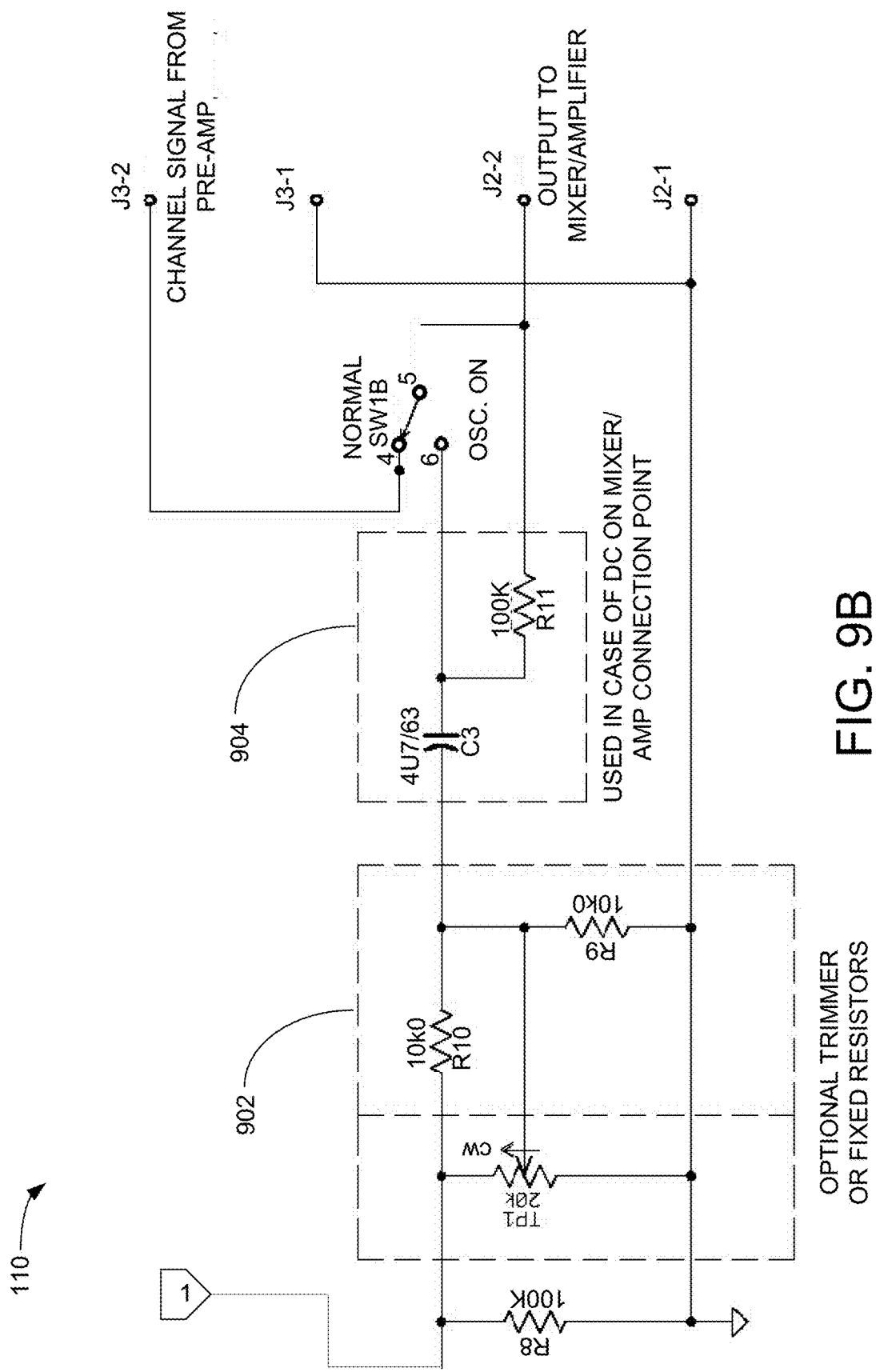
FIG. 9B is a schematic view illustrating a second portion of an exemplary embodiment of the PHD testing signal source of FIG. 9A of the self diagnostic speaker load testing system, according to a preferred embodiment of the present invention.

FIG. 8C is a schematic view illustrating a third portion of the second exemplary embodiment of a PHD analyzer 818 of the self diagnostic speaker load testing system 100 of FIG. 8A, according to a preferred embodiment of the present invention;

FIG. 9A is a schematic view illustrating a first portion of an exemplary embodiment of a PHD testing signal source 110 of the self diagnostic speaker load testing system 100, according to a preferred embodiment of the present invention. FIG. 9A illustrates the oscillator portion of the PHD testing signal source 110. Switch SW1A connects contacts 2 and 3 during operation of the self diagnostic speaker load testing system 100. Contact 3 is coupled to a clock signal or similarly varying signal to operate the Schmidt trigger oscillator. The output of the oscillator is the raw test signal. The embodiment of FIG. 9A is merely exemplary, and the exact parts illustrated need not be used where functional substitutes are available. A second portion of the schematic is in FIG. 9B, where the numbered connectors indicate corresponding lines on both FIG. 9A and FIG. 9B. The entire schematic illustrated in FIGS. 9A and 9B is in the file wrapper of U.S. provisional patent application No. 62/012, 300. The schematic is presented here for purposes of enablement. A person of skill in the art, enlightened by the present disclosure, would be able to make the PHD testing signal source 110 based on the schematic of FIG. 9A and 9B.

FIG. 9B is a schematic view illustrating a second portion of an exemplary embodiment of the PHD testing signal source 110 of FIG. 9A of the self diagnostic speaker load testing system 100, according to a preferred embodiment of the present invention. FIG. 9B illustrates a resistive attenuation network 902 with an optional trimmer resistor receiving the raw test signal and providing it to switch SW1B which, when activated, conducts the testing signal to the amplifier 114. A direct current isolator 904 may be provided before switch SW1B. Switches SW1A and SW1B are preferably both contained in switch 108 or, in another embodiment, may be commonly controlled by switch 108.

Figure 9C:
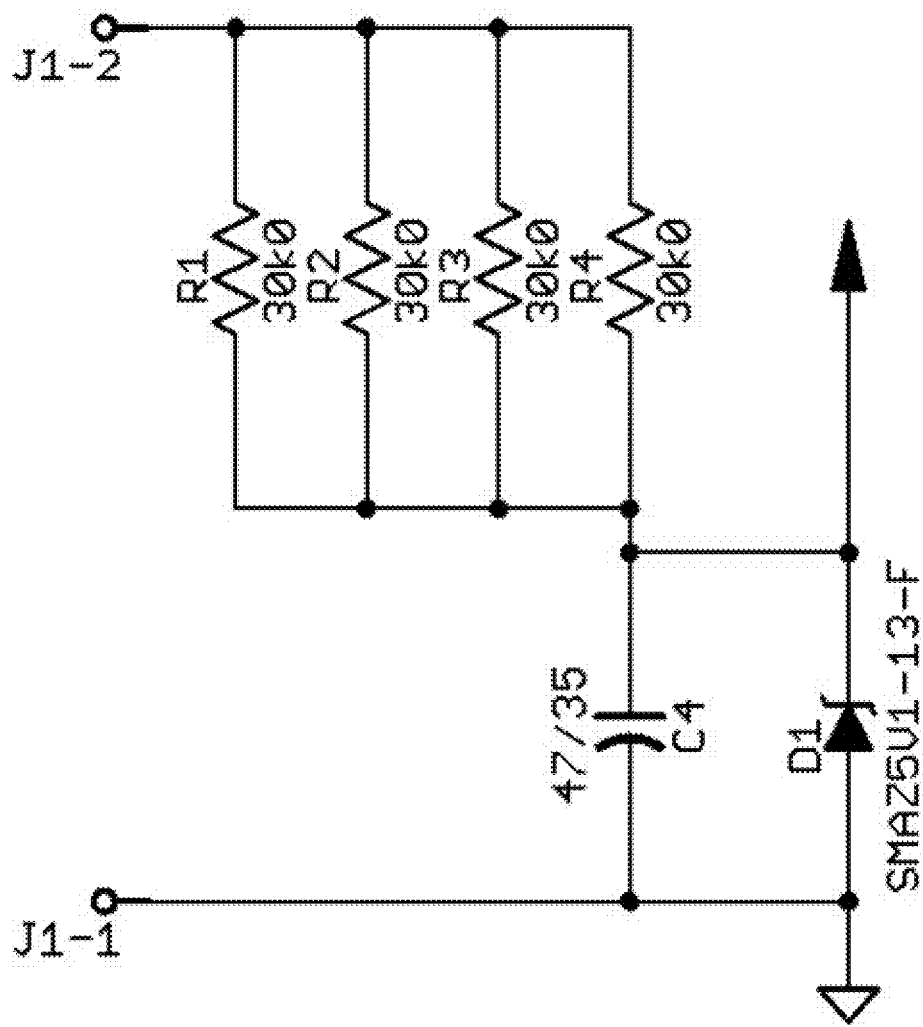
FIG. 9C is a schematic view illustrating an exemplary embodiment of a filter of the PHD testing signal source of FIG. 9A, according to a preferred embodiment of the present invention.

FIG. 9C is a schematic view illustrating an exemplary embodiment of a filter of the PHD testing signal source 110 of the self diagnostic speaker load testing system 100, according to a preferred embodiment of the present invention. The schematic is presented here for purposes of enablement. A person of skill in the art, enlightened by the present disclosure, would be able to make the filter, based on the schematic of FIG. 9C.

Figure 9D:
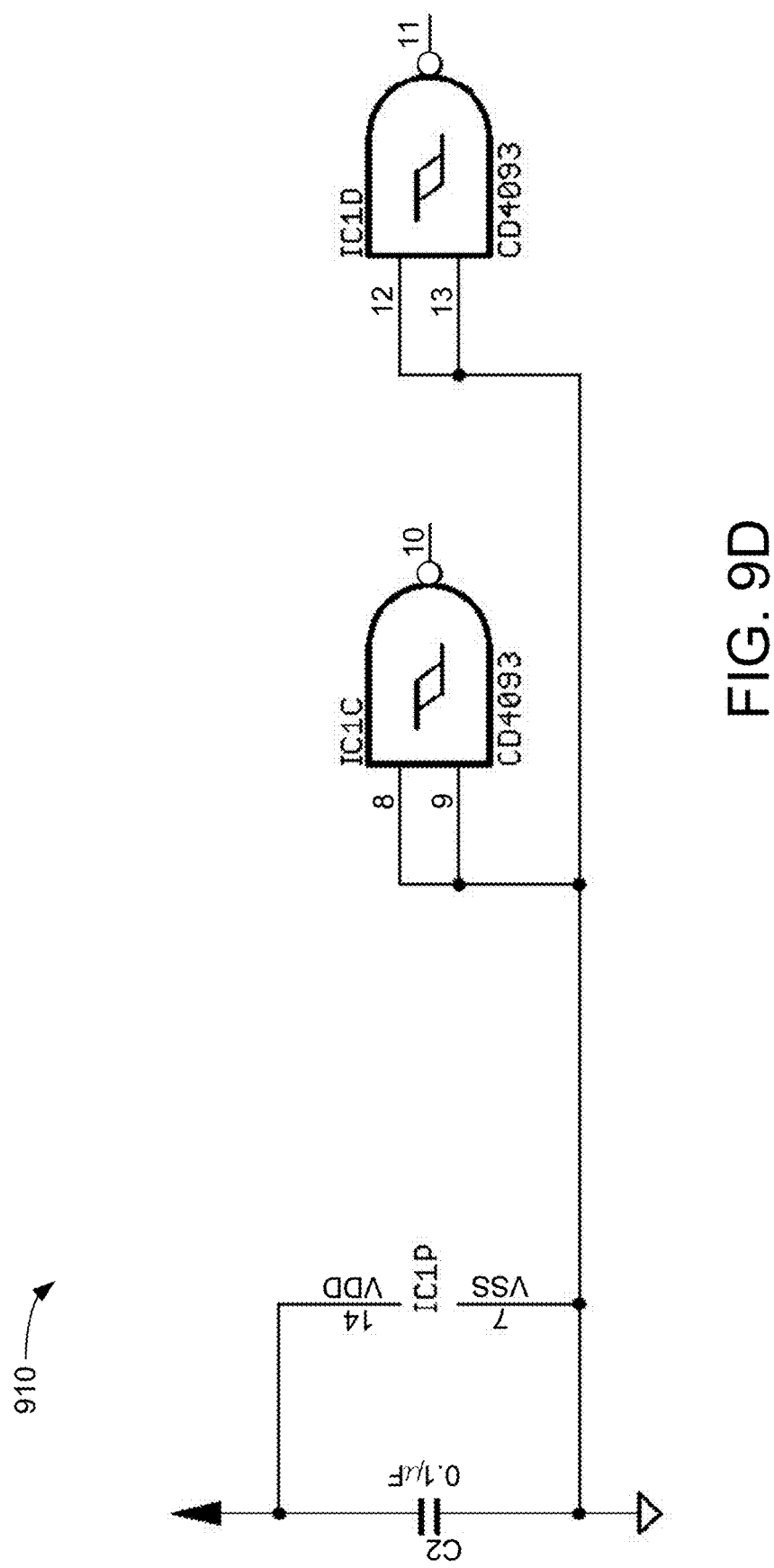
FIG. 9D is a schematic view illustrating an exemplary second embodiment an oscillator of the exemplary PHD testing signal source of FIG. 9A of the self diagnostic speaker load testing system, according to a preferred embodiment of the present invention.

FIG. 9D is a schematic view illustrating an exemplary embodiment of a second embodiment an oscillator of the exemplary PHD testing signal source 910 of the self diagnostic speaker load testing system 100, according to a preferred embodiment of the present invention. The schematic is presented here for purposes of enablement. Exemplary PHD testing signal source 910 may replace PHD testing signal source 110. A person of skill in the art, enlightened by the present disclosure, would be able to make the oscillator based on the schematic of FIG. 9D.

I claim:

1. A self-diagnostic speaker load impedance testing system, comprising:
    a. an audio mixer/amplifier comprising a housing enclosing an audio input signal mixer coupled to an amplifier configured to be coupled to a plurality of loudspeakers;
    b. a testing signal source within said audio mixer/amplifier; and
    c. a test enable switch within said audio mixer/amplifier that is:
        i. operable to couple a test signal from said test signal source into said amplifier to produce an amplified test signal;
        ii. a momentary push button switch accessible through an opening in said housing; and
    d. wherein said testing signal source within said audio mixer/amplifier comprises a direct current isolator, wherein said isolator comprises a circuit operable to isolate any direct current component of said testing signal.

2. The system of claim 1, wherein said plurality of said loudspeakers is coupled to said mixer/amplifier, the system further comprising a diagnostic analyzer within said mixer/amplifier responsive to said amplified test signal and to a collective impedance from said plurality of said coupled loudspeakers to determine if said impedance is a correct impedance match for said amplifier.

3. The system of claim 2, further comprising a fault indicator, in communication with said diagnostic analyzer, mounted on said housing, and operable to illuminate responsive to particular outcomes of said determination.

4. The system of claim 3, wherein said fault indicator illuminates responsive to an impedance that is lower than the power rating of said amplifier.

5. The system of claim 2, wherein said collective impedance includes the impedance of wiring between said mixer/amplifier and said plurality of said loudspeakers.

6. The system of claim 3, wherein said fault indicator illuminates responsive to at least one of:
    a. a short circuit in wiring between said amplifier and at least one coupled loudspeaker of said plurality of speakers; and
    b. an impedance that is lower than the power rating of said amplifier.

7. The system of claim 1, wherein said testing signal source within said audio mixer/amplifier comprises a trimmer, wherein said trimmer comprises a variable resistor operable to receive said test signal and to trim said test signal.

8. The system of claim 1, wherein at least one speaker of said plurality of speakers comprises a power transformer having a plurality of user-selectable power taps.

9. A self-diagnostic speaker load impedance testing system, comprising:
    a. an audio mixer/amplifier comprising a housing enclosing an audio input signal mixer coupled to an amplifier configured to be coupled to a plurality of loudspeakers;
    b. a testing signal source within said audio mixer/amplifier;
    c. a test enable switch within said audio mixer/amplifier that is:
        i. operable to couple a test signal from said test signal source into said amplifier to produce an amplified test signal; and
        ii. a momentary push button switch accessible through an opening in said housing; and
    d. a diagnostic analyzer within said mixer/amplifier responsive to said amplified test signal and to a collective impedance from said plurality of said loudspeakers, when coupled to said mixer/amplifier, to determine if said impedance is a correct impedance match for said amplifier; and
    e. wherein said testing signal source within said audio mixer/amplifier comprises a direct current isolator, wherein said direct current isolator comprises a circuit operable to isolate any direct current component of said testing signal.

10. The system of claim 9, further comprising a fault indicator in communication with said diagnostic analyzer, mounted on said housing, and operable to illuminate responsive to particular outcomes of said determination.

11. The system of claim 10, wherein said fault indicator illuminates responsive to an impedance that is lower than the power rating of said amplifier.

12. The system of claim 9, wherein said collective impedance includes the impedance of wiring between said mixer/amplifier and said plurality of said loudspeakers.

13. The system of claim 11, wherein said fault indicator illuminates responsive to at least one of:
    a. a short circuit in wiring between said amplifier and at least one coupled loudspeaker of said plurality of speakers; and
    b. an impedance that is lower than the power rating of said amplifier.

14. The system of claim 9, wherein said testing signal source within said audio mixer/amplifier comprises a trimmer, wherein said trimmer comprises a variable resistor operable to receive said test signal and to trim said test signal.

15. The system of claim 9, wherein at least one speaker of said plurality of speakers comprises a power transformer having a plurality of user-selectable power taps.

16. A self-diagnostic speaker load impedance testing system, comprising:
    a. an audio mixer/amplifier comprising a housing enclosing an audio input signal mixer coupled to an amplifier configured to be coupled to a plurality of loudspeakers;
    b. a testing signal source within said audio mixer/amplifier;
    c. a test enable switch within said audio mixer/amplifier that is:
        i. operable to couple a test signal from said test signal source into said amplifier to produce an amplified test signal; and
        ii. a momentary push button switch accessible through an opening in said housing;

d. a diagnostic analyzer within said mixer/amplifier responsive to said amplified test signal and to a collective impedance from said plurality of said loudspeakers, when coupled to said mixer/amplifier, to determine if said impedance is a correct impedance match for said amplifier;

e. a fault indicator, in communication with said diagnostic analyzer, mounted on said housing and operable to illuminate responsive to particular outcomes of said determination; and f. wherein said testing signal source within said audio mixer/amplifier comprises a direct current isolator, wherein said isolator comprises a circuit operable to isolate any direct current component of said testing signal.

17. The system of claim 16, wherein said collective impedance includes the impedance of wiring between said mixer/amplifier and said plurality of said loudspeakers.

18. The system of claim 17, wherein said fault indicator illuminates responsive to at least one of:

a. a short circuit in wiring between said amplifier and at least one coupled loudspeaker of said plurality of speakers; and b. an impedance that is lower than the power rating of said amplifier.

19. The system of claim 16, wherein said testing signal source within said audio mixer/amplifier comprises a trimmer, wherein said trimmer comprises a variable resistor operable to receive said test signal and to trim said test signal.

20. The system of claim 16, wherein at least one speaker of said plurality of speakers comprises a power transformer having a plurality of user-selectable power taps.

* * * * *